United States Patent [19]

Brabetz

[11] Patent Number: 5,174,020
[45] Date of Patent: Dec. 29, 1992

[54] REMELTING PROCESS FOR PRINTED CIRCUIT BOARDS

[75] Inventor: Bernhard Brabetz, Unterhaching, Fed. Rep. of Germany

[73] Assignee: Siemens Aktiengesellschaft, Munich, Fed. Rep. of Germany

[21] Appl. No.: 314,934

[22] Filed: Feb. 24, 1989

[30] Foreign Application Priority Data

Mar. 2, 1988 [DE] Fed. Rep. of Germany ....... 3806774

[51] Int. Cl.⁵ .............................................. H05K 3/34
[52] U.S. Cl. ...................... 29/840; 228/5.1; 228/20
[58] Field of Search ....... 29/840; 228/19, 20, 228/20 HT, 21, 220, 242, 5.1

[56] References Cited

U.S. PATENT DOCUMENTS

| | | |
|---|---|---|
| 3,548,062 | 12/2970 | Smith, Jr. . |
| 4,022,370 | 5/1977 | Durney ................................ 228/5.1 |
| 4,373,658 | 2/1983 | March et al. . |
| 4,538,757 | 9/1985 | Bertiger . |
| 4,580,716 | 4/1986 | Barresi et al. . |
| 4,626,205 | 12/1986 | Barkley et al. ............ 228/20 HT X |
| 4,726,506 | 2/1988 | Kondo . |
| 4,817,851 | 4/1989 | Kolesaret et al. ................ 228/20 X |

FOREIGN PATENT DOCUMENTS

| | | |
|---|---|---|
| 2502900 | 7/1976 | Fed. Rep. of Germany . |
| 3309648 | 9/1984 | Fed. Rep. of Germany . |
| 3433251 | 2/1986 | Fed. Rep. of Germany . |
| 2499228 | 6/1982 | France . |
| 924927 | 4/1982 | U.S.S.R. ................................. 228/20 |
| 2186222 | 7/1980 | United Kingdom .................. 228/20 |

OTHER PUBLICATIONS

AT&T Technical Digest No. 75 Sep. 1989 by C. Colderwood p. 11.

*Primary Examiner*—Carl J. Arbes

[57] ABSTRACT

The appearance of stresses when remelting printed circuit boards should be avoided. The remelting process of the tin-lead layers ensues in a pressure vessel at elevated ambient gas pressure. The quantity of heat required for the remaining can be supplied on the basis of known methods (infrared irradiation, oil, etc.) or by heating the compressed gas itself. As needed, the compressed gas can be designed as a protective atmosphere. Printed circuit boards of any and all types can be remelted by this process.

24 Claims, No Drawings

REMELTING PROCESS FOR PRINTED CIRCUIT BOARDS

BACKGROUND OF THE INVENTION

The invention is directed to a method for remelting voltaic tin or tin-lead layers on printed circuit boards.

As known, the reliability of all electronic devices is largely dependent on the quality of the printed circuit boards integrated therein. The quality of the printed circuit boards is in turn critically dependent on the quality of their through-connections or interlayer connections, of its layer bonding, as well as on the solderability of the printed circuit board surface.

In order to facilitate solder work on printed circuits, the copper interconnects are often tin-plated in order to avoid the oxidation of the copper surfaces. For the highest quality demands, a voltaic tin or tin-lead alloy having a tin-to-lead ratio of 20:40 is thereby applied in a thickness of 12 to 15 $\mu$m and this layer is subsequently remelted with a heating process, for example by influencing with thermal radiation or by immersing into a hot oil bath (German Published Application 25 02 900). This is necessary since such electro-deposited layers are very poorly solderable.

Stresses appear in the printed circuit board due to the thermic load on the printed circuit boards during the remelting (reflowing) of the electro-deposited metal layers and the adhesion between resin and copper decreases. There is the risk that the printed circuit board will be damaged as a result of these phenomena. This damage can be both a delamination (separating of the layers) as well as a breaking of the through-connections or interlayer connections.

Up to now, the printed circuit boards have been remelted at atmospheric pressure. Printed circuit board damage thereby had to be accepted.

SUMMARY OF THE INVENTION

An object of the invention is to provide a method for remelting tin-lead layers on printed circuit boards with which damage to these printed circuit boards due to thermic stressing is avoided.

This object is achieved by conducting the remelting process in a pressurized vessel at an elevated ambient gas pressure. The heating can occur in a known manner, such as by an oil bath within the vessel, or the heating may occur due to a heating of the gas. Further, the gas may comprise a protective atmosphere to prevent oxidation of the remelted metal surface.

The advantage of the invention is that the stresses appearing in the printed circuit boards when remelting the tin-lead layers, as a consequence of different coefficients of expansion, are compensated to such an extent by the elevated ambient pressure acting on all sides that damage to the printed circuit boards due, for example, to delamination or cracks in the through-connections or interlayer connections is prevented.

DESCRIPTION OF THE PREFERRED EMBODIMENTS

The invention shall be set forth with reference to an exemplary embodiment. An oil pan with the remelting oil at, for example, 215° C. is situated in a pressure vessel. The temperature of the remelting oil is held constant with a controlled heating system. The printed circuit board to be remelted is situated over the remelting bath. The pressure vessel is brought to a nitrogen pressure of 18 bar (atmospheres) given a nitrogen temperature of, for example, 60° C. After the desired pressure is reached, the printed circuit board to be treated is lowered into the oil bath and left therein for about 30 seconds in order to carry out the remelting process in the oil. Subsequent thereto, the printed circuit board is in turn removed from the oil bath and cooled to room temperature in the pressure vessel. The nitrogen pressure is lowered to atmospheric pressure and the treated printed circuit board is removed from the pressure vessel. Instead of nitrogen, carbon dioxide or any protective gas atmosphere that prevents an oxidation of the remelted metal surface and is also not too quickly dissolved in the remelting oil can be employed. Dependent on the structure of the printed circuit board, it may be necessary to elevate the pressure up to a level of 60 bar.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

I claim as my invention:

1. A method for remelting voltaic tin or tin-lead layers on a printed circuit board, comprising the steps:
   positioning the printed circuit board entirely within a closed vessel at least partially filled with a gas;
   elevating the ambient pressure of the gas;
   in a subsequent and separate step supplying a remelting heating to the printed circuit board at the elevated pressure.

2. A method according to claim 1, wherein a required quantity of heat for the remelting is produced by heating the compressed gas.

3. A method according to claim 1, wherein the pressurized gas prevents oxidation of the remelted metal.

4. A method according to claim 1, wherein the ambient pressure of the gas is elevated to at least 18 bar.

5. A method according to claim 1, wherein the ambient pressure of the gas is elevated to a range of 18–60 bar.

6. A method according to claim 3, wherein said pressurized gas is nitrogen.

7. A method according to claim 1, comprising the additional steps of cooling the printed circuit board after said remelting and subsequently reducing the pressure of said gas.

8. A method for remelting voltaic tin or tin-lead layers on a printed circuit board, comprising the steps:
   positioning the printed circuit board in a closed vessel at least partially filled with a gas;
   elevating the ambient pressure of the gas;
   supplying a remelting heating to the printed circuit board by thermal radiation.

9. A method according to claim 8, wherein the gas is selected to prevent oxidation of the remelted metal.

10. A method according to claim 8, wherein the pressure of the gas is elevated to at least 18 bar.

11. A method according to claim 8, wherein the pressure of the gas is elevated to a range of 18–60 bar.

12. A method according to claim 8, wherein the gas is nitrogen.

13. A method according to claim 8 comprising the additional steps of cooling the printed circuit board after said remelting and subsequently reducing the pressure of said gas.

14. A method for remelting voltaic tin or tin-lead layers on a printed circuit board, comprising the steps:
   positioning the printed circuit board entirely within a closed vessel partially filled with a gas and partially filled with a heated liquid;
   elevating the ambient pressure of the gas;
   supplying a remelting heating to the printed circuit board by immersing said printed circuit board in said liquid.

15. A method according to claim 14, wherein the pressurized gas prevents oxidation of the remelted metal.

16. A method according to claim 15, wherein said pressurized gas is nitrogen.

17. A method according to claim 14, wherein the ambient pressure of the gas is elevated to at least 18 bar.

18. A method according to claim 14, wherein the ambient pressure of the gas is elevated to a range of 18-60 bar.

19. A method for remelting metal layers on a printed circuit board, comprising the steps:
   positioning the printed circuit board entirely within a vessel at least partially filled with a gas;
   elevating the ambient pressure of the gas to at least 18 bar;
   supplying a remelting heating to the printed circuit board.

20. A method according to claim 19, wherein the ambient pressure of the gas is elevated to a range of 18-60 bar.

21. A method according to claim 19, wherein a required quantity of heat for the remelting is produced by heating the compressed gas.

22. A method according to claim 19, wherein the pressurized gas prevents oxidation of the remelted metal.

23. A method according to claim 22, wherein the pressurized gas is nitrogen.

24. A method according to claim 19 comprising the additional steps of cooling the printed circuit board after said remelting and subsequently reducing the pressure of the gas.

* * * * *